(12) United States Patent
Hu et al.

(10) Patent No.: US 11,342,529 B2
(45) Date of Patent: May 24, 2022

(54) OLED DEVICE, MANUFACTURING METHOD THEREOF, AND DISPLAY APPARATUS

(71) Applicant: BOE TECHNOLOGY GROUP CO., LTD., Beijing (CN)

(72) Inventors: Chunjing Hu, Beijing (CN); Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 96 days.

(21) Appl. No.: 16/758,987

(22) PCT Filed: May 14, 2019

(86) PCT No.: PCT/CN2019/086840
§ 371 (c)(1),
(2) Date: Apr. 24, 2020

(87) PCT Pub. No.: WO2019/219004
PCT Pub. Date: Nov. 21, 2019

(65) Prior Publication Data
US 2020/0321550 A1 Oct. 8, 2020

(30) Foreign Application Priority Data
May 16, 2018 (CN) .......................... 201810467132.3

(51) Int. Cl.
*H01L 51/52* (2006.01)
*H01L 27/32* (2006.01)
*H01L 51/56* (2006.01)

(52) U.S. Cl.
CPC ...... *H01L 51/5228* (2013.01); *H01L 27/3246* (2013.01); *H01L 51/5234* (2013.01);
(Continued)

(58) Field of Classification Search
None
See application file for complete search history.

(56) References Cited

U.S. PATENT DOCUMENTS

2008/0024057 A1* 1/2008 Kim .................... H01L 51/5203
313/504
2008/0116463 A1* 5/2008 Ito ....................... H01L 51/5203
257/72
(Continued)

FOREIGN PATENT DOCUMENTS

| CN | 101728421 A | 6/2010 |
| CN | 106328677 A | 1/2017 |

(Continued)

OTHER PUBLICATIONS

The First Office Action with Search Report dated Dec. 19, 2019 corresponding to Chinese application No. 201810467132.3.

*Primary Examiner* — Michelle Mandala
(74) *Attorney, Agent, or Firm* — Nath, Goldberg & Meyer; Joshua B. Goldberg

(57) ABSTRACT

There are provided an OLED device, a manufacturing method thereof, and a display apparatus. The OLED device includes: a first substrate; at least one auxiliary electrode disposed on the first substrate; a pixel defining structure disposed on the first substrate; and a plurality of light emitting units disposed on the first substrate. Each light emitting unit includes a first electrode, a second electrode and a light emitting layer, and the first electrode is located on a side of the second electrode distal to the first substrate, and the light emitting layer is located between the first electrode and the second electrode. The auxiliary electrode is disposed inside the pixel defining structure and electrically coupled to the first electrode.

19 Claims, 4 Drawing Sheets

(52) U.S. Cl.
CPC ........ *H01L 51/56* (2013.01); *H01L 2227/323* (2013.01); *H01L 2251/5315* (2013.01)

(56) References Cited

U.S. PATENT DOCUMENTS

2008/0150419 A1  6/2008  Kang
2017/0005150 A1* 1/2017  Yeo .................... H01L 51/5237

FOREIGN PATENT DOCUMENTS

| CN | 107331788 A | 11/2017 |
| CN | 107565048 A | 1/2018 |
| CN | 108649060 A | 10/2018 |

* cited by examiner

OLED DEVICE, MANUFACTURING METHOD THEREOF, AND DISPLAY APPARATUS

CROSS-REFERENCE TO RELATED APPLICATION

This is a National Phase Application filed under 35 U.S.C. 371 as a national stage of PCT/CN2019/086840, filed May 14, 2019, an application claiming the benefit of Chinese Application No. 201810467132.3, filed May 16, 2018, the content of each of which is hereby incorporated by reference in its entirety.

TECHNICAL FIELD

The present disclosure relates to the field of display technologies, and particularly relates to an OLED device, a manufacturing method thereof, and a display apparatus.

BACKGROUND

Organic Light Emitting Diode (OLED) devices are receiving more and more attention in fields such as display and illumination. Among them, top-emitting Active-matrix organic light emitting diode (AMOLED) may have a higher aperture ratio and brightness because shielding of a Thin Film Transistor (TFT) is avoided. Also, the top-emitting AMOLED can have advantages including reduced power consumption, improved resolution, prolonged service life of the OLED and the like.

SUMMARY

The present disclosure provides an OLED device. The OLED device may include: a first substrate; at least one auxiliary electrode disposed on the first substrate; a pixel defining structure disposed on the first substrate; and a plurality of light emitting units disposed on the first substrate. Each of the plurality of light emitting units includes a first electrode, a second electrode and a light emitting layer, and the first electrode is located on a side of the second electrode distal to the first substrate, and the light emitting layer is located between the first electrode and the second electrode. The at last one auxiliary electrode is disposed inside the pixel defining structure and electrically coupled to the first electrode. In a direction parallel to an extension direction of the first substrate, the second electrode and the light emitting layer are disposed in a pixel region defined by the pixel defining structure; and the first electrode covers the pixel defining structure, the at least one auxiliary electrode, and the light emitting layer.

In some embodiments, the first electrode is made of a transparent conducting oxide, and the auxiliary electrode is made of metal.

In some embodiments, at least a part of the auxiliary electrode is in contact with the first electrode by passing through the pixel defining structure such that the auxiliary electrode is electrically coupled to the first electrode.

In some embodiments, a through hole is disposed in a part of the pixel defining structure located on a side distal to the first substrate, and a part of the auxiliary electrode protrudes from a surface of the auxiliary electrode and is in contact with the first electrode by passing through the through hole, and the surface of the auxiliary electrode extends in the direction parallel to the extension direction of the first substrate and is far away from the first substrate.

In some embodiments, the part of the auxiliary electrode passing through the through hole has a width in the direction parallel to the extension direction of the first substrate smaller than a width of other parts of the auxiliary electrode in the direction parallel to the extension direction of the first substrate.

In some embodiments, a through hole is disposed in a part of the pixel defining structure directly above the auxiliary electrode, and the first electrode is in contact with the auxiliary electrode by passing through the through hole such that the auxiliary electrode is electrically coupled to the first electrode.

In some embodiments, the OLED device further includes: a second substrate configured to be opposite to the first substrate; a plurality of spacers disposed on the second substrate and on a side of the second substrate proximal to the first substrate; and a plurality of conductive connection structures being electrically conductive, having one-to-one correspondence with the plurality of spacers, and being on a side of the plurality of spacers proximal to the first substrate. The auxiliary electrode is in contact with a corresponding connection structure by the corresponding connection structure passing through the first electrode and the pixel defining structure such that the auxiliary electrode is electrically coupled to the first electrode.

In some embodiments, in a direction perpendicular to the extension direction of the first substrate, each of the plurality of spacers has a height h1, and each of the plurality of connection structures has a height h2, and the sum of h1 and h2 is in a range from 2.5 μm to 5 μm.

In some embodiments, an end of the corresponding connection structure in contact with the auxiliary electrode is pointed.

In some embodiments, a surface of each of the plurality of connection structures in contact with a corresponding spacer is planar, and a surface of each of the plurality of spacer in contact with a corresponding connection structure is planar.

In some embodiments, each of the plurality of connection structures has a fixing pillar protruding from a surface of the connection structure in contact with a corresponding spacer, the fixing pillar is inserted into a hole corresponding to the fixing pillar, and the hole is provided in a surface of the corresponding spacer in contact with the connection structure.

In some embodiments, the plurality of connection structures are made of metal.

The present disclosure provides a method of manufacturing an OLED device.

The method may include: forming at least one auxiliary electrode and a pixel defining structure on a first substrate; then forming a plurality of light emitting units on the first substrate. The auxiliary electrode is disposed inside the pixel defining structure. Each of the plurality of light emitting units includes a first electrode, a second electrode and a light emitting layer, the first electrode is located on a side of the second electrode distal to the first substrate, and the light emitting layer is located between the first electrode and the second electrode. In a direction parallel to the extension direction of the first substrate, the second electrode and the light emitting layer are disposed in a pixel region defined by the pixel defining structure, and the first electrode covers the pixel defining structure, the auxiliary electrode, and the light emitting layer.

In some embodiments, after forming a plurality of light emitting units the method further includes: forming a plurality of spacers on a second substrate; forming a plurality of connection structures on a side of the plurality of spacers distal to the second substrate; then matching the second substrate with the first substrate such that the auxiliary electrode is in contact with a corresponding connection structure by the corresponding connection structure passing through the first electrode and the pixel defining structure, and the auxiliary electrode is electrically coupled to the first electrode.

In some embodiments, forming at least one auxiliary electrode and a pixel defining structure on a first substrate includes: forming a TFT and a first planarization layer on the first substrate; then forming a metal layer on the first substrate, and performing photoresist coating, exposure, development and etching on the metal layer to form the auxiliary electrode layer made of metal; then forming the pixel defining structure on the first substrate such that the auxiliary electrode is disposed inside the pixel defining structure.

The present disclosure further provides a display apparatus, which may include the OLED device as described above.

BRIEF DESCRIPTION OF THE DRAWINGS

In order to make a person skilled in the art better understand technical solutions of the present disclosure, the present disclosure will be described in detail with reference to accompanying drawings and specific embodiments. Throughout the drawings, the same elements are indicated by the same reference signs.

DETAILED DESCRIPTION

One key technology in the top-emitting AMOLED is how to form a transparent electrode. The transparent electrode may be an anode or cathode of the top-emitting AMOLED. Hereinafter, the transparent electrode as the cathode will be taken as an example for illustration. In case of the transparent electrode made of metal, the metal has a good transmittance only when it is thin. However, too thin metal may result in an open circuit or oxidation of the metal, which makes it difficult to form an effective ohmic contact. Therefore, light emitted from the AMOLED is not uniform. In a case that transparent conducting oxide (TCO) such as indium tin oxide (ITO) and indium zinc oxide (ILO) is used to form the transparent electrode, conductivity of TCO is relatively poor despite good transmittance thereof. In some cases, an auxiliary electrode is provided to increase the conductivity of TCO used as the transparent electrode, such that the AMOLED can meet light emission requirements.

Figure 1:
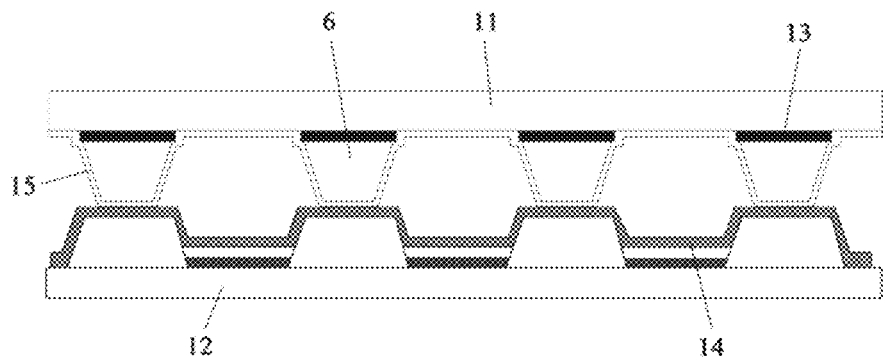
FIG. 1 is a schematic diagram of a structure of an OLED device in the related art.

As shown in FIG. 1, auxiliary electrodes 13 made of metal are disposed on an upper substrate 11, spacers 6 are disposed on the auxiliary electrodes 13, and an auxiliary transparent conductive structure 15 is disposed on the spacers 6 and electrically coupled to the auxiliary electrodes 13. By electrically coupling the auxiliary transparent conductive structure 15 to a cathode 14 as a transparent electrode on a lower substrate 12, the auxiliary electrodes 13 are electrically coupled to the cathode 14, and thus conductivity of the cathode 14 as the transparent electrode is enhanced. In some cases, the auxiliary transparent conductive structure 15 may be formed of TCO.

However, in the case that the transparent electrode is formed of TCO, the auxiliary transparent conductive structure 15 may be broken under a pressure when the pressure is applied on the spacers 6, which may cause the auxiliary electrodes 13 unable to increase the conductivity of the transparent electrode, and thus the AMOLED cannot operate normally.

Figure 2:
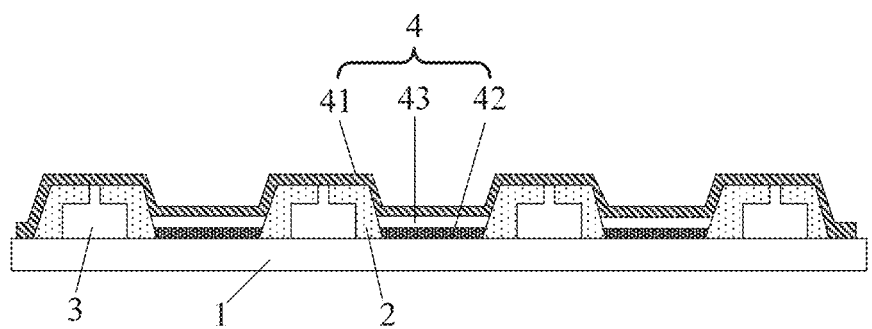
FIG. 2 is a schematic diagram of a structure of an OLED device according to an embodiment of the present disclosure.

FIG. 2 illustrates a structure of an OLED device according to an embodiment of the present disclosure. The OLED device includes a first substrate 1, a pixel defining structure 2 disposed on the first substrate 1, at least one auxiliary electrode 3, and a plurality of light emitting units 4. Each light emitting unit 4 includes a first electrode 41 as a transparent electrode, a second electrode 42, and a light emitting layer 43. In a direction perpendicular to an extension direction of the first substrate 1, the first electrode 41 is located above the second electrode 42 (that is, the first electrode 41 is located on a side of the second electrode 42 distal to the first substrate 1), and the light emitting layer 43 is located between the first electrode 41 and the second electrode 42. The auxiliary electrode 3 is disposed inside the pixel defining structure 2 and electrically coupled to the first electrode 41. In a direction parallel to the extension direction of the first substrate 1, the second electrode 42 and the light emitting layer 43 are disposed in a pixel region defined by the pixel defining structure 2, and the first electrode 41 covers the first substrate 1, the pixel defining structure 2, the auxiliary electrode 3, and the light emitting layer 43.

In an embodiment of the present disclosure, as shown in FIG. 2, the pixel defining structure 2 surrounds the auxiliary electrode 3. In other words, the auxiliary electrode 3 is configured to be located inside the pixel defining structure 2. Further, the auxiliary electrode 3 is electrically coupled to the first electrode 41 to increase conductivity of the first electrode 41. In an embodiment of the present disclosure, the auxiliary electrode 3 inside the pixel defining structure 2 and the first electrode 41 as the transparent electrode are both disposed on the first substrate 1, and the auxiliary transparent conductive structure is omitted. In this configuration, no matter how much pressure is applied on the spacers 6, the first electrode 41 can always be electrically coupled to the auxiliary electrode 3, and the auxiliary electrode 3 can in turn increase conductivity of the first electrode 41. That is, when a pressure is applied on the spacers 6, the auxiliary electrode 3 is not affected to impair the electrical connection between the auxiliary electrode 3 and the first electrode 41. In some embodiments, the first electrode 41 is made of the transparent conducting oxide, and the auxiliary electrode 3 is made of metal having good conductivity, such as copper.

Figure 3:
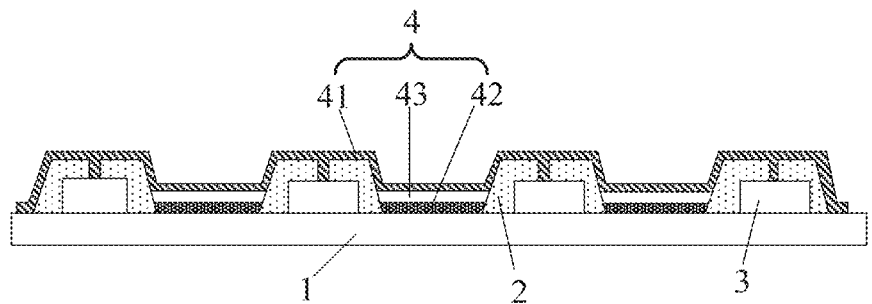
FIG. 3 is a schematic diagram of a structure of an OLED device according to an embodiment of the present disclosure.

FIG. 3 illustrates a structure of an OLED device according to an embodiment of the present disclosure. The OLED device shown in FIG. 3 has substantially a same configuration as that shown in FIG. 2. Further, in the OLED device shown in FIG. 3, the first electrode 41 may be made of the transparent conducting oxide having good transmittance, and the auxiliary electrode 3 may be made of metal having good conductivity, such as copper. Only the differences in construction of the OLED device of FIG. 3 from that of FIG. 2 will be described here.

In some embodiments, as shown in FIG. 2, at least a part of the auxiliary electrode 3 is in contact with the first electrode 41 by extending upwardly to pass through the pixel defining structure 2, such that the auxiliary electrode 3 is electrically coupled to the first electrode 41. Specifically, as shown in FIG. 2, a through hole is disposed in a part of the pixel defining structure 2 directly above the auxiliary electrode 3 (i.e., a part of the pixel defining structure 2 located on a side of the auxiliary electrode 3 distal to the first substrate 1), and a part of the auxiliary electrode 3 protrudes from a surface of the auxiliary electrode 3 and is in contact with the first electrode 41 by passing through the through hole, the surface of the auxiliary electrode 3 extends in the direction parallel to the extension direction of the first substrate 1 and is far away from the first substrate 1. As shown in FIG. 2, the part of the auxiliary electrode 3 passing through the through hole has a width in the direction parallel to the extension direction of the first substrate 1 smaller than a width of other parts of the auxiliary electrode 3 in the direction parallel to the extension of the first substrate 1.

In some embodiments, as shown in FIG. 3, the through hole is disposed in the part of the pixel defining structure 2 directly above the auxiliary electrode 3, and the first electrode 41 is in contact with the auxiliary electrode 3 by passing through the through hole, such that the auxiliary electrode 3 is electrically coupled to the first electrode 41.

It will be appreciated that the manner of electrically connecting the auxiliary electrode 3 to the first electrode 41 in the present disclosure is not limited to the above embodiments.

It should be noted that the first substrate 1 may be further provided with a buffer layer, a TFT for providing a display signal, and a first planarization layer, or the like (not shown).

In some embodiments, the first electrode 41 may be an anode, and the second electrode 42 may be a cathode. In some embodiments, the first electrode 41 may be a cathode, and the second electrode 42 may be an anode.

Figure 4:
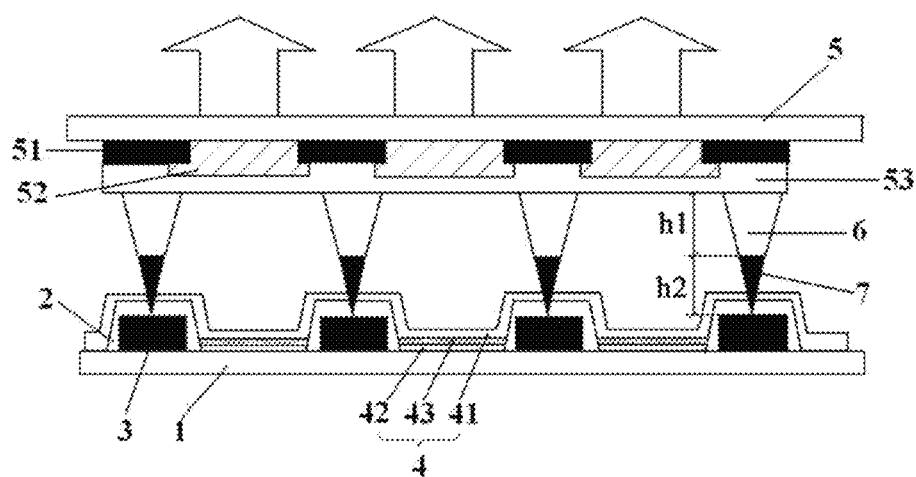
FIG. 4 is a schematic diagram of a structure of an OLED device according to an embodiment of the present disclosure.

FIG. 4 illustrates a structure of an OLED device according to another embodiment of the present disclosure. As shown in FIG. 4, the first electrode 41 is configured to be located on a side of the second electrode 42 distal to the first substrate 1, and the first electrode 41 covers the pixel defining structure 2 and the light emitting layer 43 between the first electrode 41 and the second electrode 42. The auxiliary electrode 3 is located inside the pixel defining structure 2. The OLED device further includes a second substrate 5 arranged opposite to the first substrate 1. A plurality of spacers 6 are disposed on the second substrate 5, and have a plurality of connection structures 7 thereon. The plurality of spacers 6 and the plurality of connection structures 7 have one-to-one correspondence, and each of the plurality of connection structures 7 is in contact with a spacer 6 corresponding thereto. The spacer 6 is disposed on a side of the second substrate 5 proximal to the first substrate 1, and the connection structure 7 is disposed on a side of the spacer 6 proximal to the first substrate 1. The connection structure 7 is electrically conductive. The auxiliary electrode 3 is in contact with a corresponding connection structure 7 by the corresponding connection structure 7 passing through the first electrode 41 and the pixel defining structure 2, such that the auxiliary electrode 3 is electrically coupled to the first electrode 41.

As shown in FIG. 4, the OLED device is a top-emitting OLED device. In the top-emitting OLED device, as shown in FIG. 4, the second substrate 5 is further provided with a black matrix 51, a plurality of color films 52, a second planarization layer 53 and the like. As shown in FIG. 4, the spacer 6 is dispose on a side of the second planarization layer 53 distal to the second substrate 5, and an orthographic projection of the spacer 6 on the second substrate 5 falls within an orthographic projection of the black matrix 51 on the second substrate 5. The connection structure 7 is disposed on a side of the spacer 6 distal to the second substrate 5, and an orthographic projection of the connection structure 7 on the second substrate 5 falls within the orthographic projection of the spacer 6 on the second substrate 5.

That is, the connection structure 7 is disposed on the second substrate 5, and supports the first substrate and the second substrate together with the spacer 6. Further, the connection structure 7 electrically couples the auxiliary electrode 3 to the first electrode 41.

In some embodiments, in the direction perpendicular to the extension direction of the first substrate 1, the spacer 6 has a height h1, the connection structure 7 has a height h2, and the sum of h1 and h2 is in a range from 2.5 µm to 5 µm. In the case where the spacer 6 and the connection structure 7 support the first substrate and the second substrate, a too great sum of heights of the spacer 6 and the connection structure 7 will make it difficult to match, align and assemble the first substrate with the second substrate, and a too small sum of heights of the spacer 6 and the connection structure 7 will make it impossible to electrically couple the auxiliary electrode 3 to the first electrode 41. When the sum of h1 and h2 is in the range from 2.5 µm to 5 µm, the first substrate and the second substrate can be easily matched, and the auxiliary electrode 3 can be easily electrically coupled to the first electrode 41 by the connection structure 7.

It will be appreciated that h1 and h2 are not limited thereto, but may be set as needed as long as h1 and h2 allow the first substrate and the second substrate to be easily matched, and allow the auxiliary electrode 3 to be easily electrically coupled to the first electrode 41 by the connection structure 7.

In some embodiments, a surface of each of the plurality of connection structures 7 in contact with the spacer 6 corresponding thereto may be planar, and a surface of each of the plurality of spacers 6 in contact with the connection structure 7 corresponding thereto may be planar.

In some embodiments, each of the plurality of connection structures 7 has a fixing pillar protruding from the surface of the connection structure 7 in contact with the spacer 6 corresponding thereto, and the fixing pillar is inserted into a hole corresponding to the fixing pillar, the hole is provided in the surface of the corresponding spacer 6 in contact with the connection structure 7.

That is, a protrusion as a fixing pillar may be provided on the surface of the connection structure 7 in contact with the spacer 6, and the protrusion on the connection structure 7 is inserted into the surface of the spacer 6 in contact with the connection structure 7 to increase the connection stability between the connection structure 7 and the spacer 6.

In some embodiments, an end of the connection structure 7 corresponding to the auxiliary electrode 3 proximal to the auxiliary electrode 3 is pointed. That is, an end of the connection structure 7 corresponding to the auxiliary electrode 3 distal to the second substrate 5 is pointed such that the connection structure 7 can easily be in contact with the auxiliary electrode 3 by passing through the first electrode 41 and the pixel defining structure 2, and such that the auxiliary electrode 3 is electrically coupled to the first electrode 41.

In some embodiments, the connection structure 7 is made of metal. When the connection structure 7 is made of metal, the pointed end of the connection structure 7 can pass through the first electrode 41 and the pixel defining structure 2 more easily.

It will be appreciated that the material, structure and shape of the connection structure 7 are not limited to the above embodiments, as long as the first electrode 41 can be electrically coupled to the auxiliary electrode 3 by the connection structure 7.

The sizes, dimensions, shapes, and the like of various parts of the OLED devices shown in various figures are for illustrative purposes only. In some embodiments, the parts shown as rectangular in the various figures may have a trapezoidal or any other suitable shape, or the parts shown as trapezoidal may have a rectangular or any other suitable shape. In addition, areas of projections of the respective parts on the first substrate may be the same or different.

Figure 5:
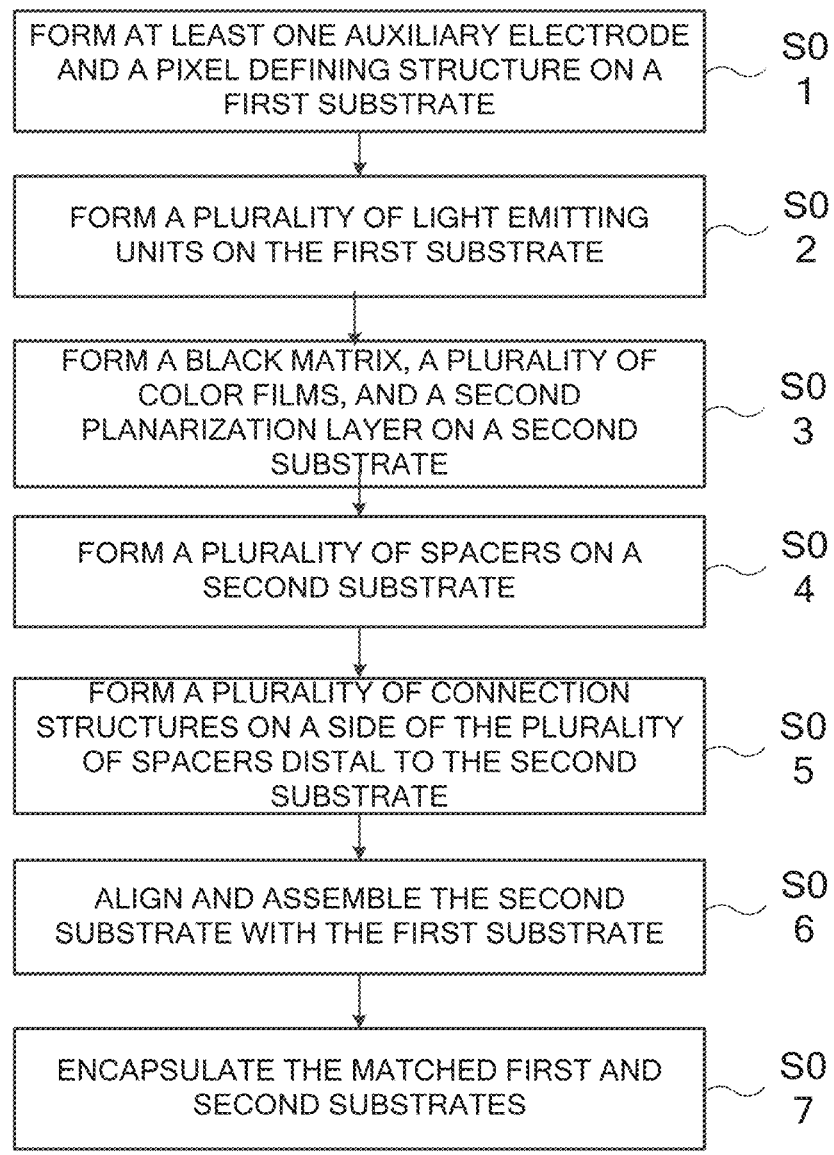
FIG. 5 is a flowchart illustrating a method of manufacturing an OLED device according to an embodiment of the present disclosure.

FIG. 5 illustrates a method of manufacturing an OLED device according to an embodiment of the present disclosure. As shown in FIG. 5. the method of manufacturing an OLED device includes the following steps S01-S07.

In step S01, at least one auxiliary electrode and a pixel defining structure are formed on a first substrate such that the auxiliary electrode is disposed inside the pixel defining structure. In an embodiment, the auxiliary electrode and the pixel defining structure are arranged as shown in FIG. 4.

Figure 6:
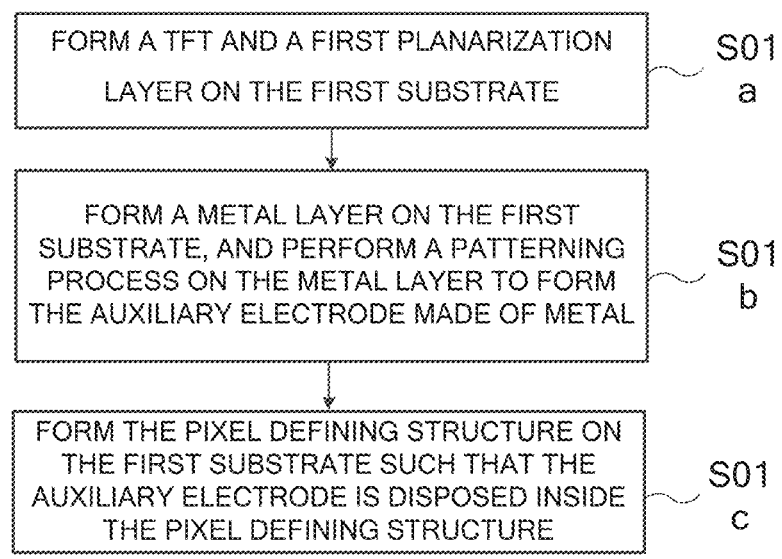
FIG. 6 is a flowchart illustrating steps of forming an auxiliary electrode and a pixel defining structure according to an embodiment of the present disclosure.

FIG. 6 illustrates a method of forming the auxiliary electrode and the pixel defining structure in step S01 according to an embodiment of the disclosure. As shown in FIG. 6, the step S01 includes the following steps S01a-S01c.

In step S01a, a TFT and a first planarization layer are formed on the cleaned first substrate. The formed TFT is similar to those in the prior art and thus is not detailed here, and the first planarization layer may be formed by a spin coating process which is also similar to that in the prior art and will not be detailed here.

In step S01b, a metal layer, which may include a multi-layer metal such as Mo/AlNd/Mo, MoNb/Cu/MoNb or an alloy thereof, is formed on the first substrate using for example a sputtering process after the above step, and then a patterning process including photoresist coating, exposure, development, and etching is performed on the metal layer to form the auxiliary electrode layer made of metal.

In step S01c, the pixel defining structure is formed on the first substrate after the above steps, such that the auxiliary electrode is disposed inside the pixel defining structure.

In step S02, a plurality of light emitting units are formed on the first substrate after the above steps. Forming a plurality of light emitting units may include: forming a second electrode, forming a light emitting layer, and forming a first electrode. For example, the light emitting units may be formed by an evaporation process. In an embodiment, the light emitting units are arranged as shown in FIG. 4.

In step S03, a black matrix, a plurality of color films, and a second planarization layer are formed on a second substrate. In an embodiment, the black matrix, the color films, and the second planarization layer are arranged as shown in FIG. 4. Specifically, a color film material layer is coated on the second substrate on which the black matrix has been formed by a spin coating process, and then a patterning process including pre-baking, exposure, development, post-baking and the like is performed on the color filter material layer to form the color films. The formed color films have a thickness of about 2.0 μm. In an embodiment, the second planarization layer may also be formed by a spin coating process, and be formed to have a thickness of about 2.0 μm.

In step S04, a plurality of spacers are formed on the second substrate after the above steps. The spacers have a height less than 2.5 μm. In an embodiment, the spacers are arranged as shown in FIG. 4.

In step S05, a plurality of connection structures are formed on the plurality of spacers. The connection structures are electrically conductive, and are formed on a side of the spacers distal to the second substrate. Specifically, a metal layer, which may be Mo/AlNd/Mo, MoNb/Cu/MoNb, iron-nickel alloy, or chromium-Cr alloy, may be formed on the spacers using a sputtering process, and then a patterning process including photoresist coating, half-mask exposure, development, etching and the like is performed on the metal layer to form the pointed connection structures on the spacers. In an embodiment, the connection structures are arranged as shown in FIG. 4.

In step S06, the second substrate is matched with the first substrate after the above steps. Specifically, the auxiliary electrode is in contact with a corresponding connection structure on the second substrate by the corresponding connection structure passing through the first electrode and the pixel defining structure on the first substrate such that the auxiliary electrode is electrically coupled to the first electrode.

In step S07, the matched first and second substrates are encapsulated to form an OLED device.

The method of manufacturing an OLED device according to the present disclosure is simple and suitable for various display apparatuses.

In an embodiment of the present disclosure, there is further provided a display apparatus including any one of the OLED devices in the above embodiments. The display apparatus that includes any one of the OLED devices as described above may be an electronic paper, an OLED panel, a mobile phone, a tablet, a television, a monitor, a laptop, a digital album, a navigator or any other apparatuses having a display function.

It will be appreciated that the above embodiments are merely exemplary embodiments for purpose of illustrating the principle of the disclosure, and the disclosure is not limited thereto. Various modifications and improvements can be made by a person having ordinary skills in the art without departing from the spirit and essence of the disclosure. Accordingly, all of these modifications and improvements also fall into the protection scope of the disclosure.

What is claimed is:

1. An OLED device, comprising:
   a first substrate;
   at least one auxiliary electrode disposed on the first substrate;
   a pixel defining structure disposed on the first substrate; and
   a plurality of light emitting units disposed on the first substrate,
   wherein each of the plurality of light emitting units comprises a first electrode, a second electrode and a light emitting layer, and the first electrode is located on a side of the second electrode distal to the first substrate, and the light emitting layer is located between the first electrode and the second electrode;
   the at least one auxiliary electrode is disposed inside the pixel defining structure and electrically coupled to the first electrode; and in a direction parallel to an extension direction of the first substrate, the second electrode and the light emitting layer are disposed in a pixel region defined by the pixel defining structure, and the first electrode covers the pixel defining structure, the at least one auxiliary electrode, and the light emitting layer;

the OLED device further comprises:

a second substrate opposite to the first substrate;

a plurality of spacers disposed on the second substrate on a side proximal to the first substrate; and a plurality of connection structures which are electrically conductive and respectively disposed on the plurality of spacers on a side proximal to the first substrate, wherein the connection structure is in contact with a corresponding auxiliary electrode by passing through the first electrode and the pixel defining structure and the auxiliary electrode is electrically coupled to the first electrode.

2. The OLED device according to claim 1, wherein the first electrode is made of a transparent conducting oxide, and the auxiliary electrode is made of metal.

3. The OLED device according to claim 1, wherein in a direction perpendicular to the extension direction of the first substrate, each of the plurality of spacers has a height h1, each of the plurality of connection structures has a height h2, and a sum of h1 and h2 is in a range from 2.5 µm to 5 µm.

4. The OLED device according to claim 1, wherein an end of the connection structure in contact with the auxiliary electrode is pointed.

5. The OLED device according to claim 1, wherein a surface of the connection structure in contact with a corresponding spacer is planar, and a surface of the spacer in contact with a corresponding connection structure is planar.

6. The OLED device according to claim 1, wherein each of the plurality of connection structures comprises a fixing pillar protruding from a surface of the connection structure in contact with a corresponding spacer, the fixing pillar is inserted into a hole corresponding to the fixing pillar, and the hole is provided in a surface of the corresponding spacer in contact with the connection structure.

7. The OLED device according to claim 1, wherein the plurality of connection structures are made of metal.

8. A method of manufacturing an OLED device, comprising:

forming at least one auxiliary electrode and a pixel defining structure on a first substrate;

then forming a plurality of light emitting units on the first substrate, wherein the at least one auxiliary electrode is disposed inside the pixel defining structure;

each of the plurality of light emitting units comprises a first electrode, a second electrode and a light emitting layer, and in a direction perpendicular to an extension direction of the first substrate, the first electrode is located on a side of the second electrode distal to the first substrate, and the light emitting layer is located between the first electrode and the second electrode; and in a direction parallel to the extension direction of the first substrate, the second electrode and the light emitting layer are disposed in a pixel region defined by the pixel defining structure, and the first electrode covers the pixel defining structure, the at least one auxiliary electrode, and the light emitting layer;

wherein after forming a plurality of light emitting units, the method further comprises:

forming a plurality of spacers on a second substrate, forming a plurality of conductive connection structures on a side of the plurality of spacers distal to the second substrate, respectively;

then aligning and assembling the second substrate with the first substrate such that the connection structure is in contact with a corresponding auxiliary electrode by passing through the first electrode and the pixel defining structure, and the auxiliary electrode is electrically coupled to the first electrode.

9. The method of manufacturing an OLED device according to claim 8, wherein forming at least one auxiliary electrode and a pixel defining structure on a first substrate comprises:

forming a TFT and a first planarization layer on the first substrate;

then forming a metal layer on the first substrate by a sputtering process, and performing photoresist coating, exposure, development and etching on the metal layer to form the at least one auxiliary electrode made of metal; and then forming the pixel defining structure on the first substrate such that the auxiliary electrode is disposed inside the pixel defining structure.

10. A display apparatus, comprising the OLED device according to claim 1.

11. The OLED device according to claim 2, wherein in a direction perpendicular to the extension direction of the first substrate, each of the plurality of spacers has a height h1, each of the plurality of connection structures has a height h2, and a sum of h1 and h2 is in a range from 2.5 µm to 5 µm.

12. The OLED device according to claim 2, wherein an end of the connection structure in contact with the auxiliary electrode is pointed.

13. The OLED device according to claim 2, wherein a surface of the connection structure in contact with a corresponding spacer is planar, and a surface of the spacer in contact with a corresponding connection structure is planar.

14. The OLED device according to claim 2, wherein each of the plurality of connection structures comprises a fixing pillar protruding from a surface of the connection structure in contact with a corresponding spacer, the fixing pillar is inserted into a hole corresponding to the fixing pillar, and the hole is provided in a surface of the corresponding spacer in contact with the connection structure.

15. The OLED device according to claim 2, wherein the plurality of connection structures are made of metal.

16. The OLED device according to claim 3, wherein an end of the connection structure in contact with the auxiliary electrode is pointed.

17. The OLED device according to claim 3, wherein a surface of the connection structure in contact with a corresponding spacer is planar, and a surface of the spacer in contact with a corresponding connection structure is planar.

18. The OLED device according to claim 3, wherein each of the plurality of connection structures comprises a fixing pillar protruding from a surface of the connection structure in contact with a corresponding spacer, the fixing pillar is inserted into a hole corresponding to the fixing pillar, and the hole is provided in a surface of the corresponding spacer in contact with the connection structure.

19. The OLED device according to claim 3, wherein the plurality of connection structures are made of metal.

* * * * *